(12) United States Patent
Kappler

(10) Patent No.: US 8,038,851 B2
(45) Date of Patent: Oct. 18, 2011

(54) DEVICE FOR THE TREATMENT, PARTICULARLY GALVANIZATION, OF SUBSTRATES

(75) Inventor: Heinz Kappler, Dornstetten-Aach (DE)

(73) Assignee: Gebr. Schmid GmbH & Co. (DE)

( * ) Notice: Subject to any disclaimer, the term of this patent is extended or adjusted under 35 U.S.C. 154(b) by 925 days.

(21) Appl. No.: 12/022,452

(22) Filed: Jan. 30, 2008

(65) Prior Publication Data

US 2008/0116059 A1    May 22, 2008

Related U.S. Application Data

(63) Continuation of application No. PCT/EP2006/007676, filed on Aug. 3, 2006.

(30) Foreign Application Priority Data

Aug. 3, 2005 (DE) .......................... 10 2005 038 450

(51) Int. Cl.
C25D 17/00 (2006.01)
B23H 7/26 (2006.01)
(52) U.S. Cl. .................... 204/202; 204/206; 204/297.14
(58) Field of Classification Search .................. 204/202, 204/206, 297.01, 297.14
See application file for complete search history.

(56) References Cited

U.S. PATENT DOCUMENTS

| | | | |
|---|---|---|---|
| 2,446,548 A * | 8/1948 | Nachtman | 204/206 |
| 3,596,012 A | 7/1971 | Jordan | |
| 4,507,181 A * | 3/1985 | Nath et al. | 205/91 |
| 4,559,123 A | 12/1985 | Moore et al. | |
| 4,662,997 A | 5/1987 | Hirt et al. | |
| 6,024,849 A | 2/2000 | Ko | |

FOREIGN PATENT DOCUMENTS

| | | |
|---|---|---|
| DE | 10323660 A1 | 12/2004 |
| EP | 0542148 A1 | 5/1993 |
| JP | 4-131397 A | 5/1992 |

* cited by examiner

Primary Examiner — Luan Van
(74) Attorney, Agent, or Firm — Akerman Senterfitt

(57) ABSTRACT

A contacting device for a galvanization apparatus comprises contacting rollers with a continuous rigid external face, which is joined to a jacket section. The jacket section is provided with an inner opening that is wider than a rotating shaft on which the contacting roller sits. This allows the contacting roller to be moved in a radial direction, wherein electric contacting and securing of a basic position is obtained via springs in every one of the radially moved positions. The moveability of the contacting roller ensures good contact as the contacting roller rests against substrates also when the substrates are uneven. The contact pressure can be relatively small.

14 Claims, 2 Drawing Sheets

DEVICE FOR THE TREATMENT, PARTICULARLY GALVANIZATION, OF SUBSTRATES

FIELD OF APPLICATION AND PRIOR ART

The invention relates to a device for the treatment of substrates or flat articles, particularly a galvanizing device for substrates or for the coating of solar modules.

DE-A-10323660 discloses a contact roller for the electrical contacting of substrates to be coated and contact zones are individually provided along the outer circumference thereof. Said zones are either movable or are elastically connected to a roller body, which is in particular made from flexible plastic, or elastically with the rotating shaft. This is in particular intended to engage the surface-extended contact zones as flat as possible on the substrates in order to bring about optimum contacting.

It is also known for permanent contacting purposes, for example as a guard electrode to engage metal wheels or the like, which are continuous on the outside, as contacting means with substrates to be coated or treated.

PROBLEM AND SOLUTION

The problem of the invention is to provide an aforementioned device or contacting means which can obviate the problems of the prior art and which in particular make it possible to keep low the pressure of the substrates exerted by the engagement of the contacting means, whilst ensuring the necessary contacting.

This problem is solved by a device having the features of claim 1. Advantageous and preferred developments of the invention form the subject matter of the further claims and are explained in greater detail hereinafter. By express reference the wording of the claims is made into part of the content of the description.

The substrates run on a passage path through a treatment chamber, which contains a treatment medium, for example an electrolytic solution. For passage purposes conveying means are provided and they both support the substrates and convey them through the treatment chamber. In addition, there are contacting means with which by means of a conductor device there is an electrical contacting or power supply with the substrates. Said contacting means have a rigid or closed continuous surface or outside with which they engage on the substrates. They also have a substantially rigid carrier or support ring as a type of inside part, the aforementioned surface or outside being fitted to the support or carrier ring as a separate part or is integrally formed by the same. According to the invention the carrier ring has a continuous inner opening. The inside diameter of this inner opening exceeds the diameter of a shaft on which a contacting means is held or rests. There is also a flexible or continuous electrical contacting from the surface or outside with the conductor device. As a result of the larger inside diameter of the inner opening the carrier ring has a certain mobility on the shaft or can be moved away or evade substrates. Thus, the contacted substrates are protected or kept free from any mechanical stressing, such as is normally the result of the application of a contacting roller or the like. In order to bring past the contacting means any unevenness or thicker areas of the substrates whilst maintaining contacting, the contacting means are in their entirety moved away or deflected, whilst maintaining contacting. As a result of the additional flexible contacting of the surface or outside with the conductor device or a power supply or the like, despite the mobility of the contacting means on the shaft a reliable electrical contact occurs. In a further development of the invention it is possible for the power supply to take place via the shaft or at least via a portion of the shaft. This is for example an infeed on an outer end of the shaft with a tap in the vicinity of the contacting means.

According to the invention the carrier ring need not be mounted directly on the shaft and instead can be placed on a thickening or an additional collar or the like. What is in fact important for the invention is that a carrier ring of the contacting means is located or held radially on the shaft, advantageously in a random radial direction. It need not necessarily be in direct contact with the shaft.

The inside diameter of the inner opening of the contacting means or the carrier ring can be at least 5%, preferably approximately 10% larger than the shaft cross-section. Preferably the inner opening and shaft have a similar cross-section and in particular circular in each case.

The carrier ring can be sleeve-like, collar-like or tubular with a certain length extension along the shaft. As a result of said length extension, apart from the greater inside diameter and therefore a somewhat looser seating, the carrier ring can be deflected away from the shaft, but cannot excessively strongly laterally tilt. As a measure for this it is for example possible to make the carrier ring longer than the diameter of the shaft or the inside diameter of its inner opening. From said sleeve-like or tubular part of the carrier ring can project radially a type of flange with the surface or outside. The flange projects advantageously centrally from the carrier ring. Particularly advantageously the surface or outside forms a widening or flattening of the projecting flange for increasing the contacting surface area on engagement with a substrate. If the contacting means is constructed in mirror symmetrical manner to a surface perpendicular to the shaft and passes through the centre of the outside, when resting on a substrate no tilting moment is exerted and there is a very uniform contacting.

In a simple construction of the contacting means, the carrier ring is integrally manufactured together with the surface or outside, namely from the same material, preferably metal, such as for example copper. For this purpose either different parts can be assembled or the contacting means can be shaped from a single metal part.

The flexible contacting on the surface or outside can be resilient or elastic. In particular, this compensates movements of the carrier ring or outside relative to the shaft, particularly if they are radial movements. It is also possible to influence these movements, which will be explained in greater detail hereinafter.

In an advantageous development of the invention an elastic or resilient holding of the carrier ring on the shaft takes place. In a normal position the carrier ring can be seated roughly concentrically on the shaft and in particular the surface or outside is concentric to the shaft. If the carrier ring or contacting means is deflected from the normal position, particularly radially and away from the substrate, the resilient holding action builds up a force bringing about a return to the normal position. The normal position is such that in it the contacting means precisely contacts in the desired manner a moving past substrate. As a function of the desired use or desired guide-back force of the contacting means the magnitude of the resilience on the holder can be determined. It is for example also possible to implement the resilient holding together with the aforementioned flexible contacting or to carry out contacting by means of the resilient holder, i.e. both functions are combined in a single component.

In a further development of the elastic holder, it is possible to construct it in such a way that the carrier ring can be moved in the longitudinal direction of the shaft out of the normal position by a small amount. Advantageously following the longitudinal movement through the resilient holder a guide-back force is built up, particularly through the same spring or same spring mechanism as for the guide-back following the radial movement. As a result the surface or outside and therefore the entire contacting means are mounted in movable manner on the shaft. As a result of the resilient holder they are brought out of their deflected position back into the normal position. Advantageously the resilience bringing about a return to the normal position is very small, so that in the case of an unevenness the contact pressure on the substrate to be contacted is limited and in this way for example in the case of sensitive solar modules made from thin glass damage can be avoided.

Such a resilient holder can for example run in helical spring-like manner over a longitudinal area of the shaft. It can engage on the shaft laterally alongside the carrier means or can be connected thereto, for example by at least one closely engaging turn. In lateral extension towards the carrier ring the turns can become larger and can engage over an aforementioned collar-like or tubular section of the carrier ring in order to hold the same. Such a resilient holder can be provided on both sides of the carrier ring and can maintain the same in the normal position. As mentioned hereinbefore, they can also form the electrical contacting via a shaft on the carrier ring and therefore on the contacting means.

It is advantageous that in the case of the inventive device the treatment medium only reaches the underside of the substrate. Thus, the top of the substrates can be kept free, which can be advantageous with respect to a contacting behaviour and also greatly reduces contamination. In conjunction therewith the contacting means engage on the top of the substrates, i.e. in the area free from the treatment medium. In particular, the contacting means only engage on the top side. If the contacting means do not come into contact with the treatment medium, it is possible to avoid the coating material being undesirably deposited on the contacting means. As a result it does not have to be removed in a complicated manner.

In a further development of the invention it is possible to provide light sources in the treatment chamber below the substrates. Particularly when coating solar modules, this offers the advantage that through light action the coating process can be positively influenced, as is known to the expert from the prior art, for example from EP-A-542148. The light sources are elongated or in the form of tubes and optionally run transversely to the passage path.

These and further features can be gathered from the claims, description and drawings and the individual features, both singly and in the form of subcombinations, can be implemented in an embodiment of the invention and in other fields and can represent independently protectable constructions for which protection is claimed here. The subdivision of the application into individual sections and the subheadings in no way restrict the general validity of the statements made thereunder.

BRIEF DESCRIPTION OF THE DRAWINGS

Embodiments of the invention are described in greater detail hereinafter relative to the attached diagrammatic drawings, wherein show.

DETAILED DESCRIPTION OF THE EMBODIMENTS

Figure 1:
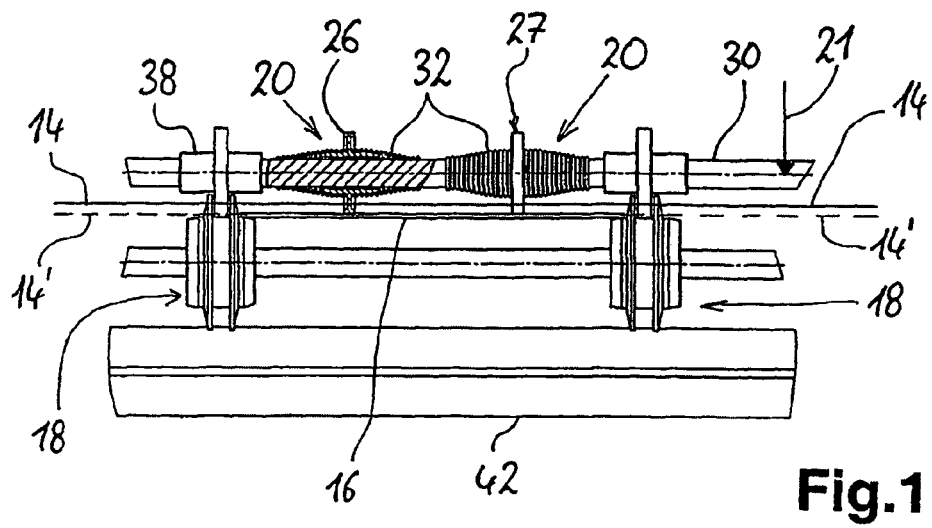
FIG. 1 A plan view of inventive contacting means on a shaft in the passage direction.

Considered in the passage direction, FIG. 1 is a plan view of the contacting rollers 20 constituting contacting means and which are mounted on a shaft 30 and rest on the top side of a substrate 16, such as a solar module or a printed circuit board. FIG. 1 shows that two juxtaposed contacting rollers 20 are arranged on shaft 30 for a substrate 16, for example for a per se known better surface distribution of the electrical contacting. The electrical contacting on shaft 30, which is made from metal or which is at least electrically conductive, takes place by means of the conductor device 21. It is also possible to convey in juxtaposed manner several webs of substrates 16, in certain circumstances whilst also adapting their format, so that different formats of substrates can be worked in precisely adapted manner. Thus, for the passage path there can be several juxtaposed conveying rollers, where the substrates are positioned precisely between said rollers. As a result they are secured against lateral displacement. The resting of the substrates on the conveying rollers can also be such that in this area the rollers have a conical construction, as can be gathered from FIG. 1. Thus, a centring and straight alignment of the substrates with the conveying rollers take place. The laterally projecting edge of the conveying rollers prevents a strong displacement of the substrates.

Figure 2:
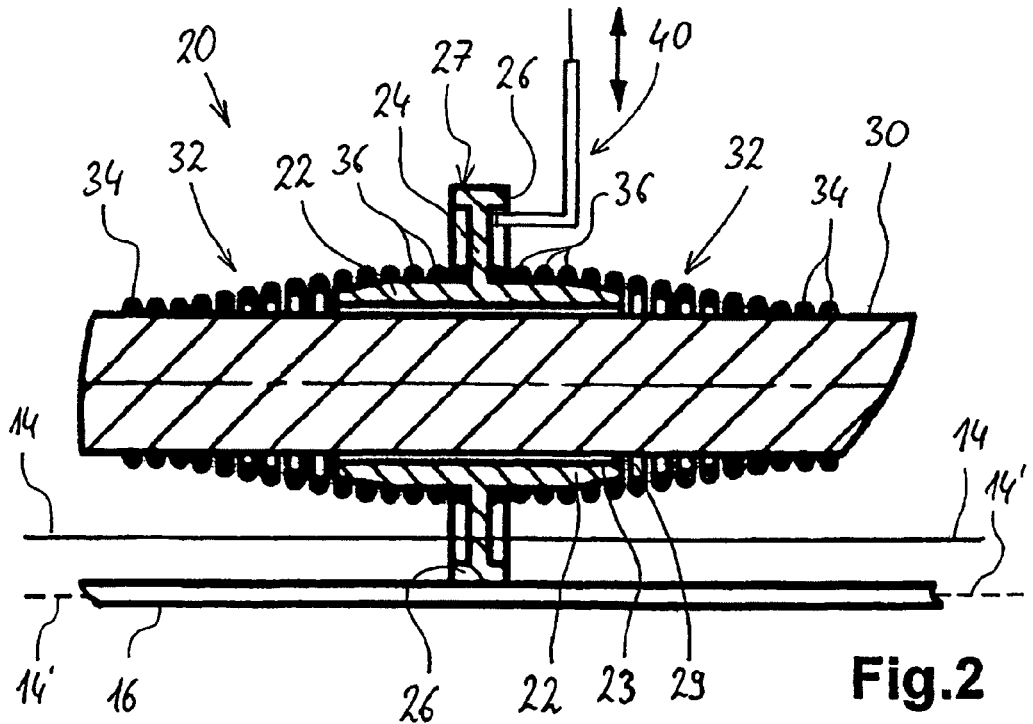
FIG. 2 A greatly enlarged representation of the contacting means of FIG. 1.

The precise construction of the contacting rollers 20 is apparent from the much larger scale view of FIG. 2. A contacting roller 20 has a sleeve 22 constituting the aforementioned collar-like or tubular part. Said sleeve 22 has an inner opening 23 through which passes the shaft 30. As the inside diameter of the inner opening 23 significantly exceeds that of the shaft 30, the gap 29 is formed. Both inner opening 23 and shaft 30 are circular, so that the sleeve 22 can move the contacting roller 20 upwards or downwards by the size of the gap 29 in the case of unevenness on the substrate 16, as will be explained hereinafter.

A flange 24 projects roughly at right angles from the central area of sleeve 22. It passes outwardly into outer ring 26 with a widened, flat outside 27. As can be gathered from FIG. 2, the contacting roller 20 is here in one piece, for example of a metal such as copper. Through the length of the sleeve 22 an excessively strong tilting of contacting roller 20 on shaft 30 is prevented. As a result of the narrow or thin construction of sleeve 22, flange 24 and outer ring 26, whilst ensuring security against tilting and a wide contacting surface through outside 27, a more lightweight construction can be achieved. This is particularly important, because the weight of contacting roller 30 plays a part in connection with the force with which it rests on the top of substrate 16.

Helical springs 32 engage over both ends of sleeve 22. In each case the helical springs 32 rest directly on shaft 30 with a remote, narrow end 34, advantageously accompanied by non-positive, frictional, immovable connection. This connection can be further improved by a groove in shaft 30. Towards the contacting roller 20 or flange 24 the turns of helical springs 32 become broader and engage over the outer areas of sleeve 22. As shown, the latter can be flattened on its outside in order to permit a continuous rise in the width of the turns of helical springs 32. By means of a wide end 36 the turns of the helical springs 32 engage directly on sleeve 22, very close to flange 24. The turns of helical springs 32 at the wide end 36 can also be such that they rest in non-positive, frictional manner on sleeve 22, in certain circumstances further improved by a milled in groove.

The resilient holding of contact roller 20 on shaft 30 by helical springs 32 leads to the contacting roller in the case of an upward deflection, not only being applied to the substrates again in the downwards direction as a result of its weight, but also as a result of spring tension. This makes it possible to ensure that on the run-up to an edge of substrate 16, the contact roller 20 does not jump upwards with a brief interruption of the electrical contacting and instead always remains pressed on. This pressure force is relatively limited in order to protect sensitive substrates. As a result of the resilient holder the contacting roller 20 is secured against longitudinal displacement, a certain mobility existing. However, following a deflection, the contacting roller 20 is always forced back by the helical springs 32 into the normal position shown in FIG. 2. In addition, the helical springs 32 also fulfil the function of electrically contacting the contacting roller 20 with shaft 30, once again on conductor device 21 and power source 13.

If in the case of a similar contacting or galvanizing device a greater mobility of the contacting roller on shaft 30 is required, it would be possible to enlarge the inner opening 23 or gap 29. It is also conceivable that in place of the outwardly engaging helical springs 32, a spring mechanism could be placed in the inner opening 23, for example with a radially resilient action and it could also be in the form of a very elastic foam or the like. Such a foam could be introduced as a further sleeve or hose-like article between shaft 30 and inner opening 23. Electrical contacting then takes place for example either via a helical spring or an electrical conductivity of the foam or a freely connected conductor between contacting roller 20 and shaft 30 or conductor device 21.

Besides compensating a possible unevenness on the substrate 16, the mobility of the contacting rollers 20 relative to shaft 30 also serves to raise the same by means of a displacement device 40. The latter engages with a hook-like section from at least one side and preferably with two facing hooks from both sides, below the outer ring 26 and can bring about a forced raising of the contact roller 20 from substrate 16. This can for example be used for removing undesired coatings of electrolytic solution 14 on outer ring 26 by reversing the polarity of power source 13.

The advantage of such a movably mounted contacting roller 20, which is admittedly rigid and solid, but is movable or resilient with respect to the substrates, is that compared with the inherently flexible contacting rollers known from the prior art, the construction of the contacting roller here is much simpler. As will be apparent, a contacting roller 20 according to FIG. 2 can be relatively easily rough worked or cast from a solid piece. In particular, the contacting roller has no movable parts. There is also no particular problem encountered when manufacturing the helical springs 32 and this also applies to the fitting of the two parts on shafts 30. The contacting rollers as wearing parts must be frequently replaced, quite independently of their construction, so that a simple, inexpensive manufacture of said rollers is very important.

Figure 3:
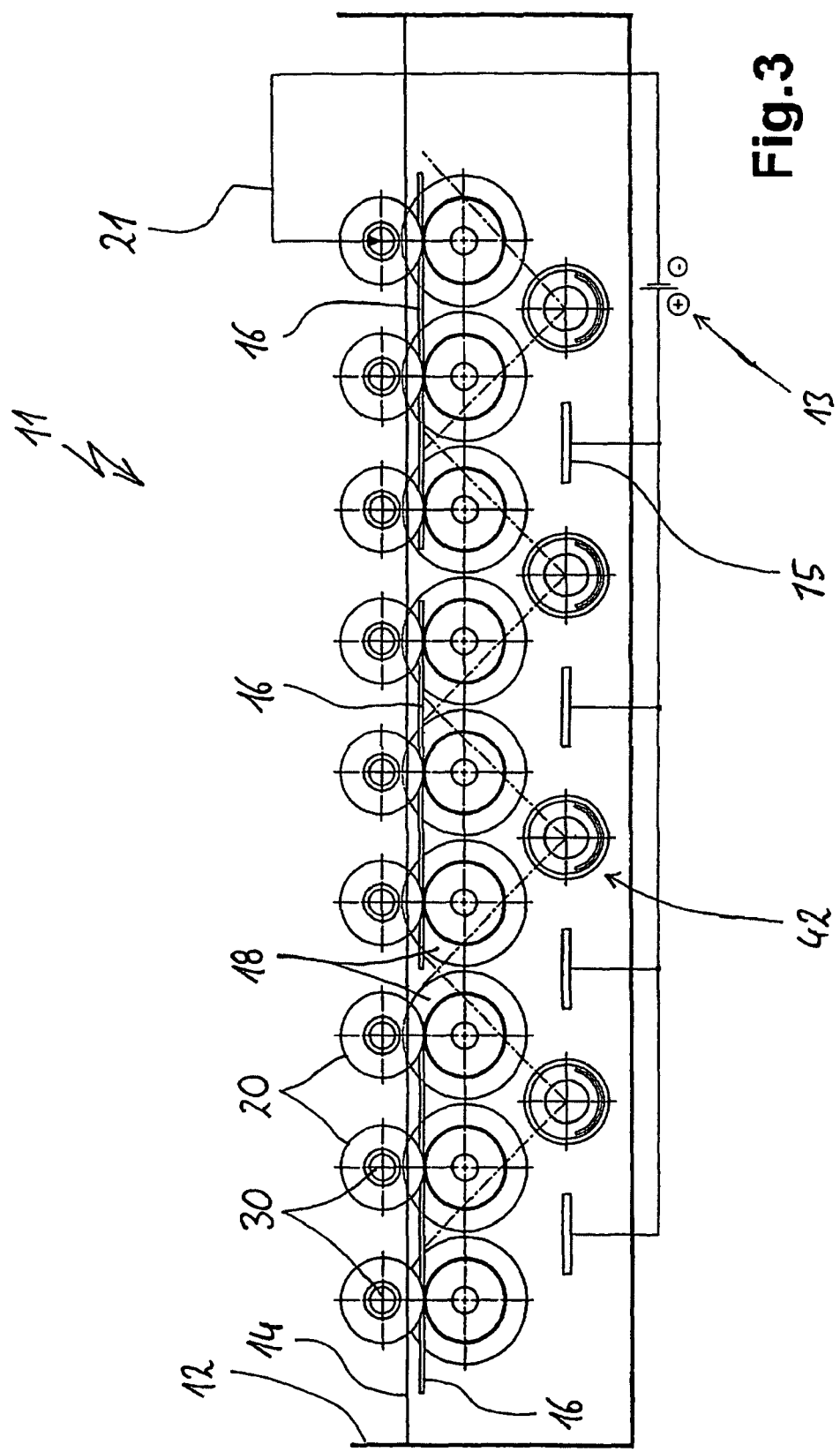
FIG. 3 A galvanizing device with said contacting means in side view.

FIG. 3 illustrates the installation procedure of a complete galvanizing device 11. It has a treatment chamber 12 with power source 13, which on the one hand is connected to electrodes 15 in electrolytic solution 14 in treatment chamber 12 and on the other to conductor device 21. Conveying rollers 18 are placed in known manner at the bottom of treatment chamber 12 and on the same engage substrates 16 and are conveyed therewith. Contacting rollers 20 engage on the top of substrates 16. As can be gathered from both FIGS. 1 and 3, the shafts 30 engage via driving wheels 38 on conveying rollers 18 and by means of the same are also rotated or driven. As the substrates 16 run precisely between the shafts of conveying rollers on the one hand and shafts 30 of contacting rollers 20 on the other, conveying rollers 18 and contacting rollers 20 rotate at the same speed. As a result it is possible for only the shafts of conveying rollers 18 to be driven.

Moreover, light tubes 42 are placed below substrates 26, namely between the electrodes 15 in each case. There can also be light sources over substrates 16. These light tubes emit with radiation or emission areas indicated in dot-dash line manner the underside of substrate 16, which in this case are advantageously PV or solar modules. As a result the galvanizing action can be improved by self-generation of the galvanizing current, such as is for example known from EP-A-542148. The intensity of the light sources can be controlled in order to influence the deposition rates on the solar modules. The wavelength can be between 400 nm and 1100 nm. The light sources can as an alternative to light tubes also be individual emitters, for example in punctiform or rectangular form. To intensify the action reflectors can also be provided. The light tubes can also be equipped for immersion.

FIG. 1 more particularly shows how the substrates 16 run entirely below the level of electrolytic solution 14, i.e. are completely immersed. Thus, also the outer rings 26 of contacting rollers 20 run in electrolytic solution 14. In another development of the invention the electrolytic solution level can be lower, for example at the level 14' shown in broken line form, so that the underside only of substrates 16 is wetted. As a result the top of substrates 16 can remain dry and therefore the contacting rollers 20 or their outer rings 26 are free from electrolytic solution.

Besides an advantageous use of contacting rollers 20 for electrical connection to power source 13 for galvanizing substrates 16, said rollers can also be used to apply a protective potential to the substrates, for example to solar modules, which as substrates 16 run through the plant. A guard electrode can be constructed as a sacrificial anode. This also prevents corrosion, so that no power source is connected here. On the back of the solar modules is provided an aluminium coating. If said aluminium coating is contacted via contacting rollers 20 and via conductor device 21 a protective potential is applied, the dissolving of the aluminium can be prevented. In this case, the above-described generation of the galvanizing current by the light tubes 42 can be particularly advantageous.

In addition, guard anodes can be provided, which can be positioned in spaced manner with respect to the cathodes or electrodes 15 and parallel thereto. They can have a soluble or insoluble construction. A protective potential can be applied by means of said guard anodes and in certain circumstances also by means of contacting rollers 20. This can take place in the stripping operation, i.e. when undesired coatings are removed by reversing the polarity. This in particular makes it possible to remove undesired coatings from the contacting rollers 20 and here the substrates can be used as counterelectrodes. When the contacting rollers are in a raised position it is possible to use them as guard anodes. For a continuous, uninterrupted coating operation a contacting roller should always engage on a substrate. Thus, the contacting rollers can for example be raised in alternating manner for removing the coating and lowered for contacting the substrates.

The application of the protective potential can take place overall and also locally in an adjustable, regulated or controller manner, which can take place by means of one or more rectifiers. In certain circumstances this can also apply to groups of contacting rollers or even individual contacting rollers, so that a removal of coatings can be carried out in planned manner, especially on individual contacting rollers. As a result other contacting rollers can continue to fulfil the contacting function.

The invention claimed is:

1. A device for treatment of substrates or flat articles on a passage path through a treatment chamber with a treatment medium, the device comprising:
    conveying means for conveying said substrates through said treatment chamber; and
    a contacting roller for electrically contacting said substrates by a conductor device connected to a power supply, said contacting roller being held on a shaft,
        wherein said contacting roller comprises:
            a substantially rigid carrier ring having a sleeve part in a longitudinal extension along said shaft and a projecting part provided radially on said sleeve part for engagement on said substrates, wherein said carrier ring has an inner opening whose inside diameter is at least 5% greater than a diameter of said shaft; and
            an elastic or resilient holder for holding said carrier ring on said shaft,
        wherein said carrier ring has a normal position on said shaft, in which said carrier ring is seated roughly concentrically on said shaft, and wherein on deflecting said carrier ring from said normal position, said holder builds up a back-guiding force guiding said carrier ring back to said normal position.

2. The device according to claim 1, wherein said inner opening and said shaft have a similar cross-section.

3. The device according to claim 1, wherein a length of said carrier ring exceeds said shaft diameter.

4. The device according to claim 1, wherein said projecting part comprises a flange provided radially on said carrier ring.

5. The device according to claim 4, wherein said flange has a flattened surface for increasing a contacting surface area on engagement with said substrates.

6. The device according to claim 1, wherein said holder has a resilient construction for compensating movements of said carrier ring relative to said shaft.

7. The device according to claim 1, wherein said holder has a resilient construction for compensating radial movements of said carrier ring relative to said shaft.

8. The device according to claim 1, wherein said holder allows a movement of said carrier ring in a longitudinal direction of said shaft from said normal position to a given longitudinal point of said shaft, wherein on leaving said normal position, said holder builds up a counteracting force for return of said carrier ring to said normal position.

9. The device according to claim 1, wherein said holder is in the form of a helical spring that runs in helical screw-like manner over a longitudinal part of said shaft and is connected laterally alongside said carrier ring to said shaft with at least one circumferential turn, wherein said holder has increasingly larger turns in a lateral extension engaging in holding manner over tubular sections of said carrier ring.

10. The device according to claim 9, wherein two of said helical springs extend from both ends of said carrier ring away from one another onto said shaft and are connected or fixed to said shaft.

11. The device according to claim 1, further comprising a displacement device engaged on said carrier ring for moving said carrier ring away from said surface of said substrates.

12. The device according to claim 1, wherein during passage of said substrates on said passage path, only an underside of said substrates comes into contact with said treatment medium.

13. The device according to claim 1, wherein said contacting roller rests only on top of said substrates.

14. The device according to claim 1, wherein light sources are placed below said substrates and within said treatment medium, wherein said light sources are elongated in the form of tubes.

* * * * *